United States Patent [19]

Kraus

[11] Patent Number: 4,606,114

[45] Date of Patent: Aug. 19, 1986

[54] MULTILEVEL OXIDE AS DIFFUSION SOURCE

[75] Inventor: Karl H. Kraus, Missouri City, Tex.

[73] Assignee: Texas Instruments Incorporated, Dallas, Tex.

[21] Appl. No.: 645,583

[22] Filed: Aug. 29, 1984

[51] Int. Cl.⁴ ............................................ H01L 21/385
[52] U.S. Cl. ........................................ 29/571; 29/578; 148/187; 148/188
[58] Field of Search ................. 148/187, 188; 29/571, 29/578

[56] References Cited

U.S. PATENT DOCUMENTS

| | | | |
|---|---|---|---|
| 3,887,733 | 6/1975 | Tolliver et al. | 148/187 X |
| 4,055,444 | 10/1977 | Rao | 148/187 X |
| 4,204,894 | 5/1980 | Komeda et al. | 148/188 |
| 4,224,089 | 9/1980 | Nishimoto et al. | 148/187 X |
| 4,271,582 | 6/1981 | Shirai et al. | 29/571 |
| 4,273,805 | 6/1981 | Dawson et al. | 148/187 X |
| 4,348,802 | 9/1982 | Shirato | 148/188 X |
| 4,355,454 | 10/1982 | Tasch, Jr. et al. | 29/571 |
| 4,361,949 | 12/1982 | Hori et al. | 148/188 X |
| 4,388,121 | 6/1983 | Rao | 148/187 X |
| 4,404,733 | 9/1983 | Sasaki | 148/188 X |
| 4,455,325 | 6/1984 | Razouk | 148/187 X |
| 4,499,653 | 2/1985 | Kub et al. | 29/578 X |

*Primary Examiner*—George T. Ozaki
*Attorney, Agent, or Firm*—John G. Graham

[57] ABSTRACT

A method of manufacture of a semiconductor device such as an MOS dynamic read/write memory cell array uses a doped multilevel oxide layer as a diffusion source to create source/drain regions and diffused interconnects. The process is thereby simplified since an ion implant ordinarily used for this purpose is avoided. The doped oxide subjected to a heat treatment for drive-in and densification, then is reflowed after contact holes are etched.

10 Claims, 10 Drawing Figures

MULTILEVEL OXIDE AS DIFFUSION SOURCE

BACKGROUND OF THE INVENTION

This invention relates to semiconductor devices and methods of manufacture, and more particularly to an improved method for making source/drain diffusions in the manufacture of read/write memory devices or the like, using N-channel silicon gate processing.

Semiconductor devices such as read/write memory arrays are commonly made by single-level or double-level polysilicon N-channel self-aligned processes such as shown, for example, in U.S. Pat. Nos. 4,055,444 and 4,388,121, issued to G. R. Mohan Rao, assigned to Texas Instruments.

In the processes used for these prior dynamic RAM cell arrays, the bit lines and source/drain regions were usually formed by an N+ arsenic implant. The implant was performed after the polysilicon (used as a self-aligning mask and as the MOS transistor gate) had been patterned.

The arsenic implant (or phosphorus predeposition) and its associated process steps, such as a thermal oxidation, add complexity to the manufacturing sequence, and, just as from any other process steps, contribute to defect densities and thereby reduce the yield. As set forth in pending application Ser. No. 156,533 entitled "Shielding for Implant in Manufacture of Dynamic Memory" filed, June 5, 1980, assigned to Texas Instruments, the arsenic implant can cause a build-up of charge on the transistor gates, resulting in thin oxide failures.

Phosphosilicate glass is used in fabrication of MOS devices for electrical isolation between the top layer metallization and underlying polysilicon. This material acts as a barrier against diffusion of mobile ions, improving the stability of the device. The glass is reflowed after contact holes have been etched, providing a smooth contour and improving integrity of the step coverage for the metal interconnects.

It is the principal object of this invention to provide an improved method of making semiconductor dynamic read/write memory devices or the like. Another object is to provide a simplified method of making memory cell arrays or other semiconductor devices of small cell size, yet by a process compatible with standard N-channel processing.

SUMMARY OF THE INVENTION

In accordance with an illustrative embodiment of the invention a method of manufacture of semiconductor devices such as an MOS dynamic read/write memory cell array uses a doped multilevel oxide layer as a diffusion source to create source/drain regions and diffused interconnects. The process is thereby simplified since an ion implant ordinarily used for this purpose is avoided. The doped oxide is subjected to a heat treatment for drive-in and densification, then is reflowed after contact holes are etched.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
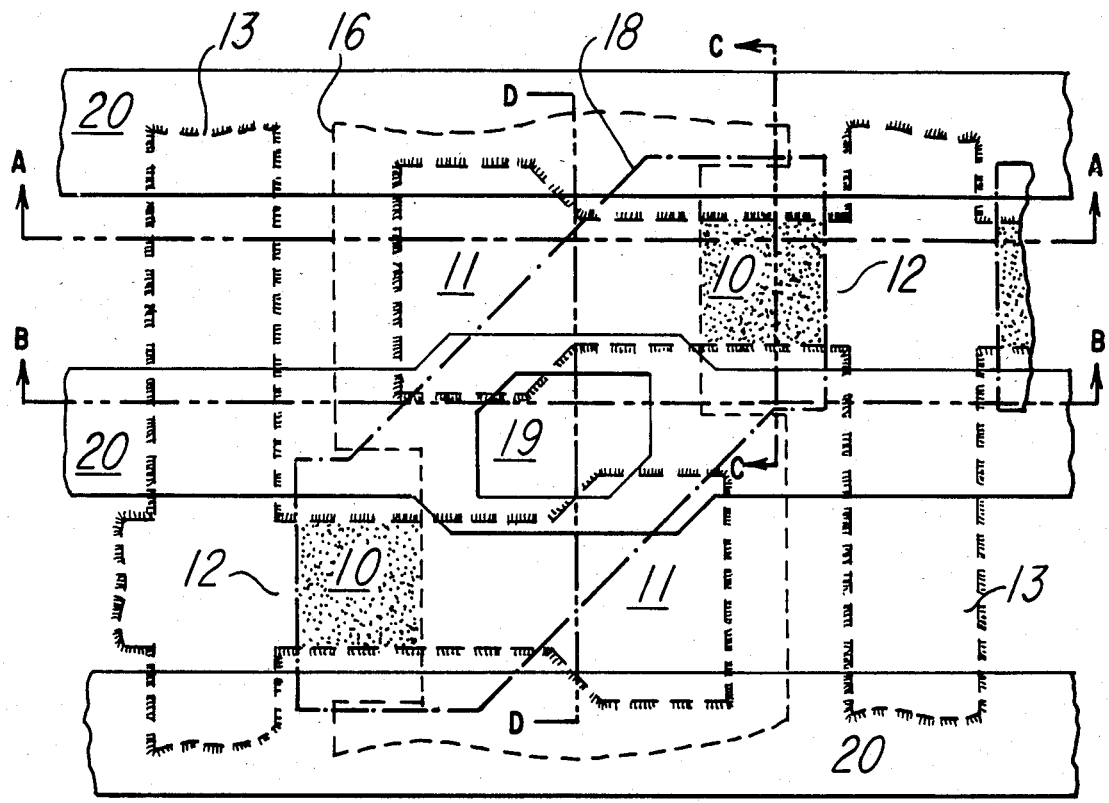
FIG. 1 is a greatly enlarged plan view of a small portion of a semiconductor chip showing the physical layout of a part of a dynamic memory cell array which may be made according to the invention.

With reference to FIGS. 1, 2, and 3a-3d, an array of one-transistor dynamic memory cells is illustrated which may be made according to the invention. Each memory cell includes an MOS access transistor 10 and an MOS capacitor 11. Each access transistor has an N+ source (or drain) region 12 which is part of one of a large number of elongated columns or bit lines 13 formed by N+ regions diffused into the face of the silicon bar 40 using multilevel oxide as a diffusion source. The capacitors 11 include inverted regions 15 in the surface of the silicon created by a Vcc voltage, about 5 v, on first level polycrystalline silicon strips 16 which extend along the columns. The gates 17 of the access transistors 10 are formed by second level polycrystalline silicon segments 18, each of which forms gates for two of the transistors. The segments 18 extend over the first level polysilicon to provide contact areas 19 where connection is made to metal row or word lines 20. Each contact area 19 is shared by two cells.

The first level polysilicon strips 16 are separated from the silicon in the area of the capacitors 11 by a thin thermal oxide coating 21, and a similar silicon oxide coating 22 separates the gates 17 from the silicon at the transistors 10 as well as separating the remainder of the second level poly segments 18 from the first level poly. A thick layer 23 of deposited doped phosphosilicate glass separates the polysilicon layers from the metal lines 20, and also functions as a diffusion source. A thick layer of thermal silicon oxide 24 surrounds all of the moat areas on the face of the silicon bar; that is, all areas not occupied by the transistors 10, capacitors 11 and bit lines 13 are covered by this field oxide 24. The edges of bit line region 13 is established by the junctions 36 between region 13 and field oxide 24. Similarly, field oxide 24 defines one edge 37 of capacitor 11.

Figure 2:
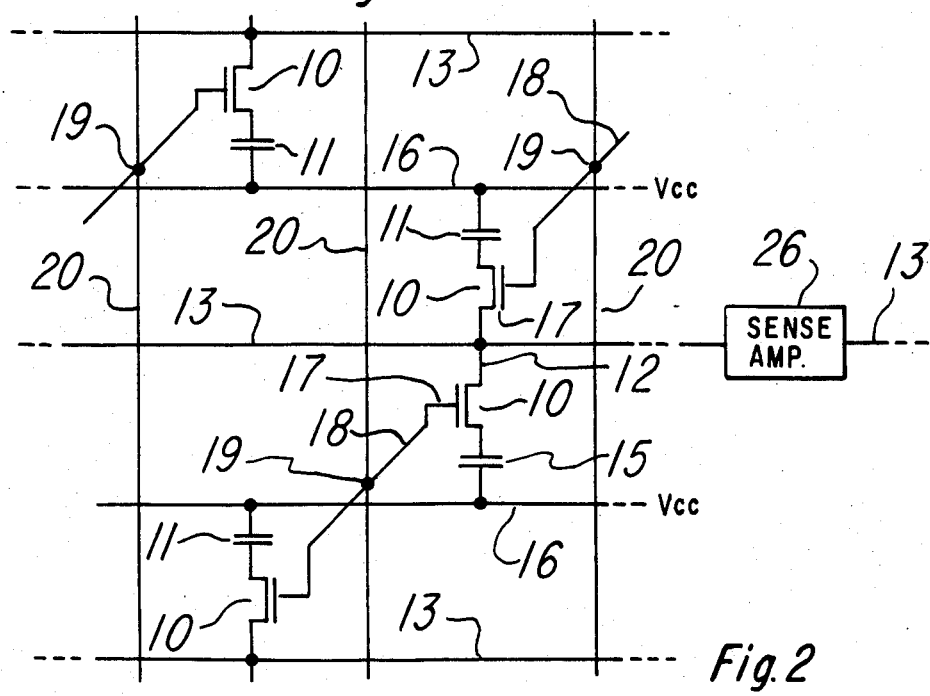
FIG. 2 is an electrical schematic diagram of the part of the cell array of FIG. 1.
Figure 3A:
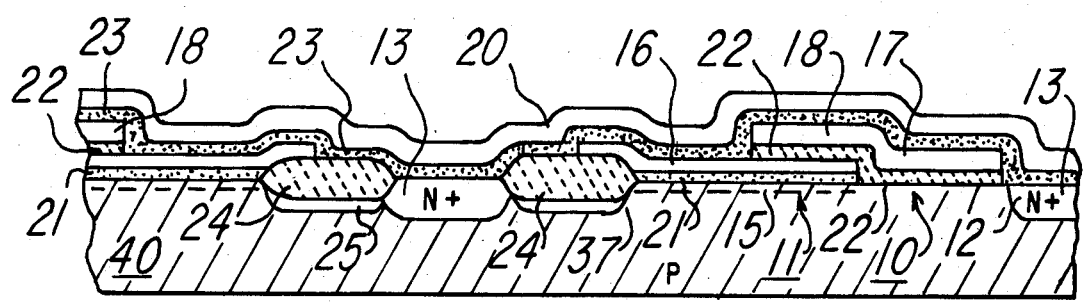
FIGS. 3a-3d are elevation views in section of the cells of FIG. 1, taken along the lines a—a, b—b, c—c, and d—d, respectively.
Figure 3B:
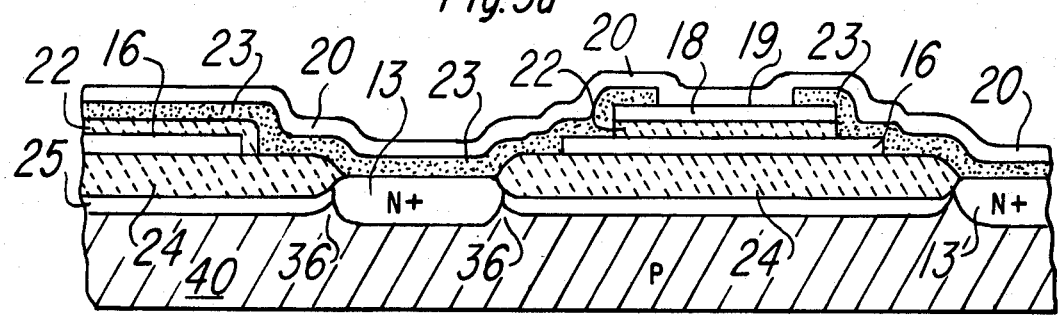
Figure 3C:
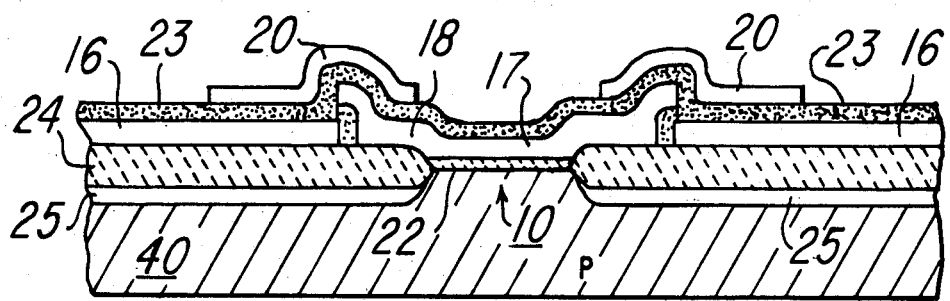
Figure 3D:
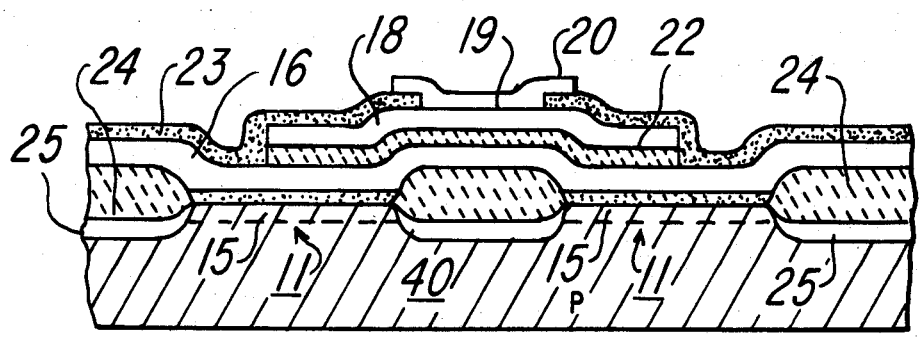

The cell array, of which FIG. 1 is a small part, would typically contain perhaps 64K or 256K cells on a silicon bar which is about 160 mils on a side or about 25,000 sq. mil area, depending upon the bit density. The four cells shown would be on a minute part of the bar, perhaps one or two mils wide. A 64K RAM would require 256 of the X address lines or row lines 20, and 256 of the bit or Y lines 13, providing 65,536 bits. As seen in FIG. 2, each of the pairs of bit lines 13 is connected to opposite sides of a differential sense amplifier 26 of the type shown in U.S. Pat. Nos. 4,701,081 or 4,293,993.

Turning now to FIGS. 4a-4d, a process for making the DRAM cell array of FIGS. 1 and 3a-3e, using a process according to the invention, will be described. The starting material is a slice of P-type monocrystalline silicon. In the figures the portion shown of the bar 40 represents only a very small part of the slice, perhaps one or two mils wide. After appropriate cleaning, the slice is oxidized by exposing to oxygen in a furnace at an elevated temperature to produce an oxide layer 41 over the entire slice, then a layer 42 of silicon nitride is deposited over the entire slice. A coating of photoresist is applied to the entire top surface of the slice, then exposed to ultraviolet light through a mask which defines the desired pattern of the thick field oxide 24 and the P+ channel stops 25. The resist is developed, leaving areas where nitride is then removed by etching the exposed part of the nitride layer 42 but leaving in place the oxide layer 41. Using photoresist and nitride as a mask, the slice is subjected to an implant step to produce the channel stop regions; to this end boron atoms are introduced by ion implant into unmasked regions 43 of silicon. The regions 43 will not exist in the same form in the finished device, because silicon will be consumed in the field oxidation procedure. Usually the slice is subjected to a heat treatment after the boron implant but prior to field oxide growth, as set forth in U.S. Pat. No. 4,055,444, assigned to Texas Instruments.

Figure 4A:
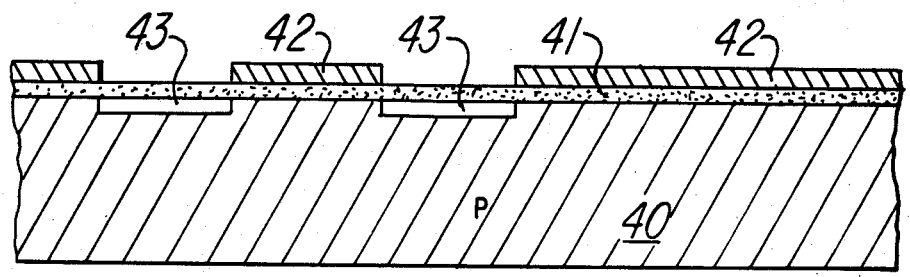
FIGS. 4a-4d are elevation views in section of the cell array of FIGS. 1 and 3a-3d, at successive stages in the manufacturing process, taken generally along the line a—a in FIG. 1.
Figure 4B:
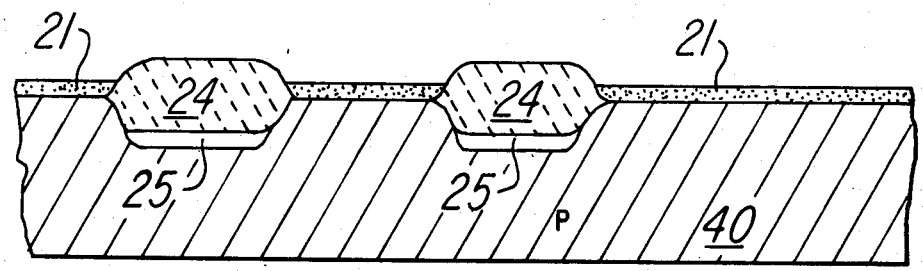

The next step in the process is the formation of field oxide 24, by subjecting the slices to steam or an oxidizing atmosphere in a furnace for several hours. This causes a thick field oxide layer 24 to be grown as seen in FIG. 4b, extending into the silicon surface as silicon is consumed upon oxidation. The remaining parts of the nitride layer 42 mask oxidation. The boron doped P+ regions 43 formed by implant diffuse further into the silicon ahead of the oxidation front to produce P+ field stop regions 25, deeper than the original regions 43.

Next the remaining nitride layer 42 is removed by an etchant which attacks nitride but not silicon oxide, then the oxide 41 is removed by etching and the exposed silicon cleaned. The silicon oxide 21 for the capacitors is grown by thermal oxidation.

Figure 4C:
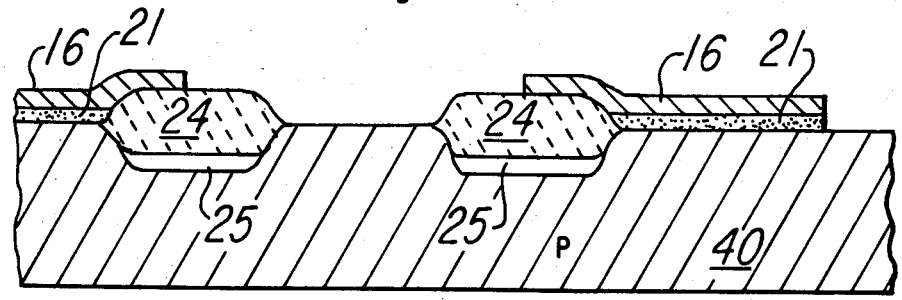
Figure 4D:
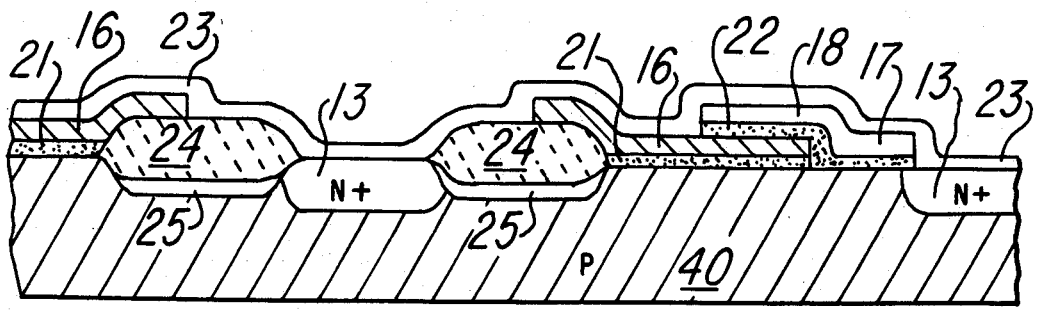

As seen in FIG. 4c, a first layer of polycrystalline silicon is deposited over the entire slice in a reactor using standard techniques, and this layer is doped with phosphorus by an N+ deposition to make it highly conductive. This first level polysilicon layer is patterned by applying a layer of photoresist, exposing to ultraviolet light through a mask prepared for this purpose, developing, then etching the exposed polysilicon to define the capacitor gates or strips 16 in the cell array. The oxide 21 not covered by first level polysilicon 16 is removed by etching.

The upper surface of the first level polysilicon as well as exposed silicon is oxidized by exposing the slice to an oxidizing atmosphere in a furnace to create the second thin thermal oxide layer 22 over the channels of the transistors 10 and over the capacitor gates 16. A second level of polycrystalline silicon is next deposited over the slice using standard techniques, then masked by photoresist and etched to leave the segments 18 which also form the transistor gates 17. The photoresist is removed by ashing (i.e., burning), and the silicon surface is cleaned.

It is at this point that the process departs from the standard; usually the slice would have been subjected to an arsenic implant to create the N+ regions 12 and 13, masked by the second level poly gate 17. However, this implant step is not performed in the present process.

According to the invention, a thick layer 23 of doped silicon oxide is deposited by decomposition of silane at a low temperature, about 400° C. The deposited silicon dioxide contains phosphorus at about 8% by weight. This layer 23 insulates the metal level from the layers of polycrystalline silicon, and is ordinarily referred to as multilevel oxide. In addition, this doped oxide functions as the diffusion source to create the regions 12 and 13 and to dope first and second polycrystalline silicon levels 16 and 18, respectively. To this end, a combined drive-in and steam densification step is performed: the slice is placed in a furnace at about 820° C. in nitrogen, the temperature is raised to 950° C. at ten °C./min, then held for ten minutes, still in a nitrogen atmosphere, ramped back down to 820° C. at 3.5 °C./min, then held at 820° C. in steam for 20 minutes, then the atmosphere is changed back to nitrogen.

Referring to FIGS. 1 and 3a-3d, the multilevel oxide layer 23 is next patterned by a photoresist operation using positive photoresist and a dry etch, exposing the contact areas 19 for metal-to-polysilicon contacts along the word lines 20 in the cell array. The metal contacts and interconnections are made in the usual manner by depositing a thin film of aluminum over the entire top surface of the slice then patterning it by a photoresist mask and etch sequence. This leaves the metal strips 20.

A thick protective oxide layer (not shown) covers the metallization, with apertures etched in this layer above bonding pads. This layer is non-thermal oxide deposited at low temperature in accord with standard MOS maufacturing methods. Usually this covers everything except the bonding pads on a bar.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making a semiconductor device comprising the steps of:
    applying a conductor layer to a face of a semiconductor body and patterning said layer to define a mask for self-alignment,
    applying a coating of doped insulator to said face,
    heating said body to simultaneously cause densification of said device and diffusing of conductivity determining impurity from said insulator into said face, using said conductor layer as a mask,
    opening contact holes in said insulator,
    again heating said body for reflowing said doped insulator to smooth the contour of said sontact holes,
    and depositing a metallic layer over said insulator and into said contact holes.

2. A method according to claim 1 wherein said heating step simultaneously drives said impurity into said conductor layer to establish a desired level of conductivity therein.

3. A method according to claim 1 wherein the insulator is phosphorus-doped silicon oxide.

4. A method according to claim 3 wherein the conductor is polycrystalline silicon.

5. A method according to claim 4 wherein the semiconductor body is silicon.

6. A method according to claim 5 wherein the conductor layer is the gate of an N-channel MOS transistor.

7. A method according to claim 6 wherein the metallic layer is aluminum.

8. A method of making a MOS transistor device comprising the steps of:
  applying a coating of phosphorus-doped silicon oxide to a face of a semiconductor body,
  heating said body of simultaneously cause densification of said device and diffusing of conductivity determining impurity from said insulator into said face, using said conductor layer as a mask,
  opening contact holes in said insulator,
  again heating said body for reflowing said doped insulator to smooth the contour of said contact holes, and depositing a metallic layer over said insulator and into said contact holes.

9. A method according to claim 8 wherein the phosphorus-doped silicon oxide contains about 8% by weight of phosphorus.

10. A method according to claim 9 wherein the gate is polycrystalline silicon.

* * * * *